United States Patent
Rodriguez et al.

(10) Patent No.: US 7,729,156 B2
(45) Date of Patent: Jun. 1, 2010

(54) CYCLING TO MITIGATE IMPRINT IN FERROELECTRIC MEMORIES

(75) Inventors: John Anthony Rodriguez, Dallas, TX (US); Sanjeev Aggarwal, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 115 days.

(21) Appl. No.: 11/964,223

(22) Filed: Dec. 26, 2007

(65) Prior Publication Data

US 2009/0168487 A1 Jul. 2, 2009

(51) Int. Cl.
*G11C 11/22* (2006.01)
(52) U.S. Cl. ............ 365/145; 365/189.17; 365/200
(58) Field of Classification Search ............ 365/145, 365/65, 49.13, 189.17, 200
See application file for complete search history.

(56) References Cited

U.S. PATENT DOCUMENTS

| | | | | |
|---|---|---|---|---|
| 5,525,528 A | * | 6/1996 | Perino et al. ............ 438/3 |
| 5,953,245 A | * | 9/1999 | Nishimura ............ 365/145 |
| 6,069,817 A | * | 5/2000 | Shin et al. ............ 365/145 |
| 2004/0190322 A1 | * | 9/2004 | Baumann et al. ............ 365/145 |

* cited by examiner

*Primary Examiner*—Pho M Luu
*Assistant Examiner*—Tha-o Bui
(74) *Attorney, Agent, or Firm*—Rose Alyssa Keagy; W. James Brady; Frederick J. Telecky, Jr.

(57) ABSTRACT

The method includes storing a memory data state in the ferroelectric memory cell. An event will trigger the evaluation of signal margin on a memory cell. If the memory cell is identified to have a weak signal, the memory cell is exercised. Exercising includes either performing one or more data read/re-write events or performing one or more simulated data read and data write events of an alternating high data state and a low data state to the memory cell associated with the weak data bit. Both the lifetime retention testing and the memory data state exercising are performed in the background of normal memory operation.

16 Claims, 6 Drawing Sheets

US 7,729,156 B2

CYCLING TO MITIGATE IMPRINT IN FERROELECTRIC MEMORIES

FIELD OF INVENTION

The present invention relates generally to semiconductor devices and more particularly to reduction of imprint for ferroelectric random-access memory (FRAM) arrays with low impact on memory system availability.

BACKGROUND OF THE INVENTION

In recent years the market of the semiconductor industry has grown considerably for supplying integrated chips to companies that manufacture portable electronic device. The integrated chips used to make these portable electronic device, such as cell phones, PDAs, laptop computers and the like, are mostly made in emerging technology nodes. This is because emerging technology nodes offer higher density chips with greater performance and lower power consumption. These qualities are important to portable electronic devices which are continually striving to offer greater functionality while relying on relatively small energy sources (e.g., batteries). The demand for these products has driven the industry to devote many resources to developing low power integrated chips, often resulting in specific integration processes.

One aspect of power consumption in integrated circuits is the power consumption of memory cells. Memory can be broadly grouped into two categories, volatile memory and non-volatile memory. Volatile memory (e.g., SRAM, DRAM) is memory which requires power to retain its information. Non-volatile memory (e.g., EEPROM, flash) is memory which does not require power to retain its information. In recent years, the use of non-volatile memory has become common place in portable electronics. Many portable electronic devices such as cell phones or digital cameras will rely upon a stick or card which uses flash memory as storage. Unfortunately, the performance and density of flash memory and other wide spread commercially available non-volatile memory sources lags behind that of volatile memory.

In recent years, semiconductor research has increased its emphasis on ferroelectric memory as an alternative to commercially available non-volatile memories. Ferroelectric random-access memory (FRAM) is a non-volatile random access memory that offers advantages in terms of power consumption and write speed over existing non-volatile memory sources such as flash or EEPROM. There are still obstacles standing in the way of FRAM becoming an important part of the memory market, but its potential advantages point towards it as a possible contender for the future of non-volatile memory.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a method for reducing the imprint of a ferroelectric memory cell. The method comprises storing a memory data state in the ferroelectric memory cell. An event will trigger an evaluation of the signal margin of the memory cell. If the memory cell is identified to have a weak signal, the memory cell is exercised. Exercising comprises either performing one or more data read/re-write events or performing one or more simulated data read and data write events of an alternating high data state and a low data state to the memory cell associated with the weak data bit. Both the signal margin evaluation and the memory data state exercising are performed in the background of normal memory operation.

An alternative embodiment of the present invention also relates to a method for reducing the imprint of a ferroelectric memory cell. The method comprises storing a memory data state in the ferroelectric memory cell. An event will trigger the evaluation of signal margin of the memory cell. If the memory cell is identified to have a weak signal, a memory data state stored in the memory cell is rewritten to a separate memory location. The memory cell is then exercised by either performing one or more data read/re-write events or performing one or more simulated data read and data write events of an alternating high data state and a low data state to the memory cell associated with the weak data bit. Once exercising is complete, the data state stored in the separate memory location is re-written to the memory cell, therefore returning the data state of the memory cell to its original data state. Additional embodiments of memory arrays and methods of inversion are also disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
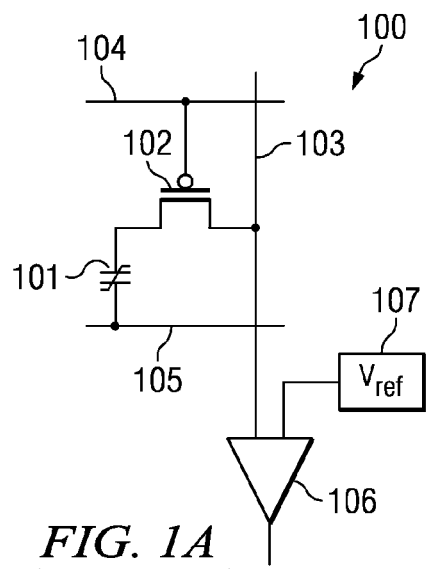
FIG. 1A shows a basic 1T/1C ferroelectric memory cell.

The present invention will now be described with reference to the attached drawing figures, wherein like reference numerals are used to refer to like elements throughout and wherein the illustrated structures and devices are not necessarily drawn to scale.

FIG. 1A shows an exemplary single transistor, single capacitor (1T/1C) ferroelectric memory cell 100. This memory cell comprises a ferroelectric capacitor 101 with a first terminal coupled to a plate line 105 and a second terminal coupled to a transistor 102. The transistor is further coupled to a bit line 103 and a word line 104 at its gate. When a voltage greater than the threshold voltage of the transistor 102 is applied to the word line 104 the transistor 102 turns on, coupling the ferroelectric capacitor 101 to the bit line 103. The bit line 103 is further coupled to a sense amplifier 106 which is coupled to a reference voltage source 107. The reference voltage source 107 provides a reference voltage. The sense amplifier 106 compares the reference voltage to the output of the bit line 103. If the bit voltage is higher than the reference voltage, the sense amplifier 106 will pull the output voltage up. If the bit voltage is lower than the reference voltage, the sense amplifier 106 will drive the output voltage down.

Figure 1B:
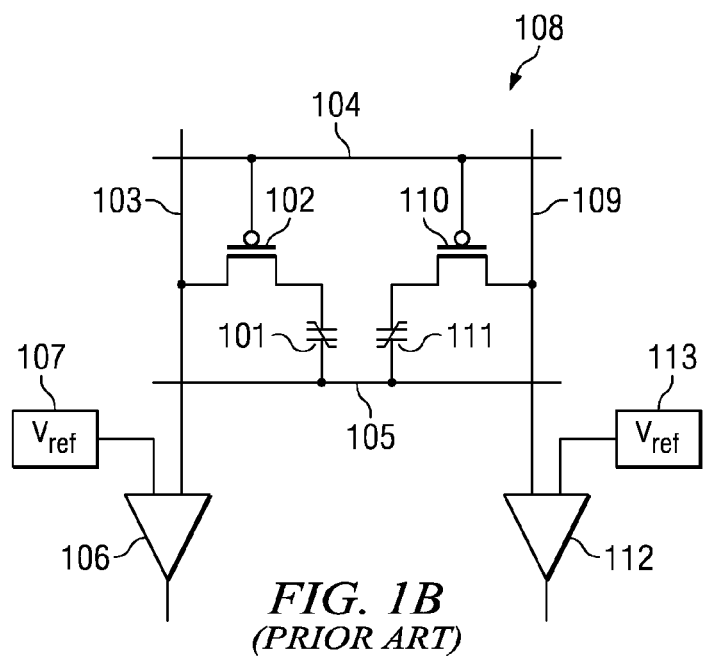
FIG. 1B shows a basic 2T/2C ferroelectric memory cell.

Variations in the architecture of memory cell 100 can also be used to form an FRAM memory cell. FIG. 1 B shows a double transistor, double capacitor (2T/2C) structure 108 which uses two transistors and two capacitors to form FRAM memory cells, for example. The 2T/2C structure stores a bit and a complimentary bit in ferroelectric capacitors 101 and 111, respectively. The bit is access by way of the word line 104 and the bit line 103. The complimentary bit is accessed by way of the word line 104 and a complimentary bit line 109. Furthermore, depending on circuit architecture, the reference voltage source can comprise either a voltage reference generator or one or more reference capacitors integrated into the memory array and coupled, through a bit line, to the sense amplifier 105.

The methods and structures described in this disclosure are applicable to a 1T/1C ferroelectric memory cell, a 2T/2C ferroelectric memory cell, or other possible variations of FRAM architecture. Also, while this disclosure will refer to FRAM memory devices, it is understood that the memory devices may be other memory devices as well. For example, memory devices may include memory cells having elements other than ferroelectric capacitive elements that may be affected by imprint or memory devices that may be impacted by signal margin reduction due to time elapse or temperature exposure.

The ferroelectric capacitors used in FRAM memory cells comprise the same geometric structure as traditional, dielectric filled, capacitors but use ferroelectric material in place of the dielectric material. Ferroelectric materials undergo a polarization similar to dielectric materials upon subjection to an electric field. However, ferroelectric materials differ from dielectric materials in that, upon removal of the electric field, they retain a degree of polarization. This is the property that allows ferroelectric capacitors to be used in non-volatile memory cells.

Figure 1C:
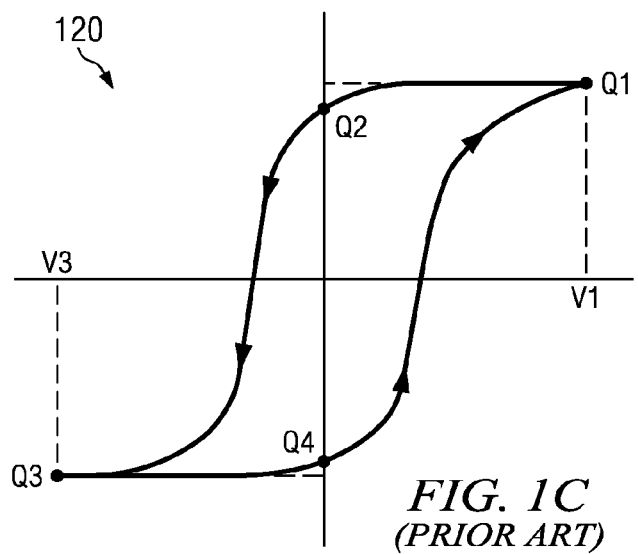
FIG. 1C shows an exemplary hysteresis curve for a ferroelectric material.

FIG. 1C shows a common hysteresis loop 120 for an FRAM memory cell. FRAM memory cells are formed from capacitors which comprise a ferroelectric material between their anode and cathode plates. The ferroelectric material exhibits hysteresis as shown in FIG. 1C. Hysteresis properties are essential to the operation of FRAM memory cells. FIG. 1 illustrates a curve showing the total charge on the capacitor as a function of the applied voltage. As the applied voltage changes, the charge stored on the capacitor will follow the curve of FIG. 1C. For example, when a voltage, V1, is applied to the ferroelectric capacitor the dipoles of the ferroelectric material will polarize, storing a charge, Q1, on the ferroelectric capacitor. When the applied voltage is removed, the charge on the ferroelectric capacitor will follow the curve to the point Q2. Application of a negative voltage, V3, across the ferroelectric capacitor will drive the charge stored along the curve to Q3. Upon removal of the applied voltage a charge of Q4 will remain on the ferroelectric capacitor. The charge remaining on the capacitor when it is at zero volts, Q2 or Q4, corresponds to data states of "0" or "1". Therefore, FIG. 1C shows how data states are stored by a ferroelectric capacitor in the absence of an applied voltage (i.e., in a non-volatile manner).

Figure 2:
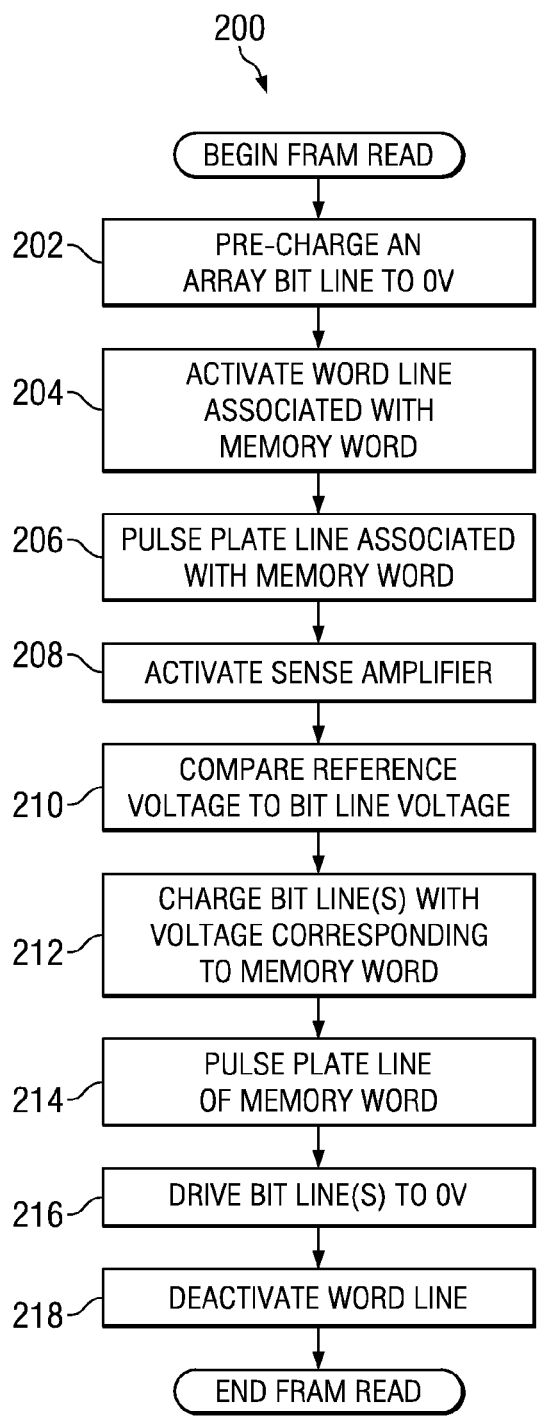
FIG. 2 shows an exemplary method for reading an FRAM memory cell.

FIG. 2 shows a prior art method 200 of reading from the ferroelectric memory cell of FIG. 1A by applying voltages along the bit line, word line, and plate line of the memory cell. At 202 the bit line 103 associated with the memory cell that is to be read is pre-charged to 0V. The word line 104 is then activated at 204. The activation of the word line 104 couples the bit line 103 to the ferroelectric capacitor 101. At 206 the plate line 105 is pulsed enabling charge sharing between the bit line 103 and the ferroelectric capacitor 101. This charge sharing discharges the ferroelectric capacitor 101 into the bit line 103 raising the voltage of the bit line 103. At 208 the sense amplifier 106 is turned on. The sense amplifier compares the voltage of the bit line 103 to a reference voltage from the reference voltage generator 107 at 210. If the bit line voltage is above the reference voltage it will be pulled up. If the bit line voltage is below the reference voltage it will be driven down.

Reading a high data state (i.e., "1") from a ferroelectric memory cell is a destructive action (i.e., upon being read a "0" is written to all ferroelectric capacitor cells). Therefore, a memory word must often be rewritten to the ferroelectric capacitor 101 after it is read. At 212 the bit line 103 is charged to a voltage that corresponds to the memory state that was read from the memory cell coupled to the bit line 103. The plate line 105 is pulsed at 214, causing charge sharing between the bit line 103 and the ferroelectric capacitor 101. This charge sharing charges the ferroelectric capacitor 101 to store the data state associated with the voltage of the bit line 103. After the pulse is over, at 216 the bit line 102 is driven to 0V. At 218 the word line 103 is deactivated. Writing data to a ferroelectric memory cell is done in a manner similar to steps 212 to 218 of FIG. 2.

Imprint is the tendency of a ferroelectric capacitor which stays in the same polarization state over a long period of time to preferentially maintain that state, weakening the ability to write and read the complement polarization state. Imprint has the effect of shifting the hysteresis loop of a ferroelectric material with respect to the applied voltage. This effect has important implications for ferroelectric memory arrays. Over time, imprint will create a growing offset voltage which decreases signal margin between states and eventually makes distinction of data states (e.g., "0" or "1") impossible.

Imprint is one area which is commonly identified as a failure mechanism of FRAM memory. Different materials or memory cell architectures may display more or less robust characteristics of reliability, but to some extent all materials will face some degradation due to imprint over time. Elevated temperatures have also been shown to increase the rate at which imprint occurs.

Figure 3:
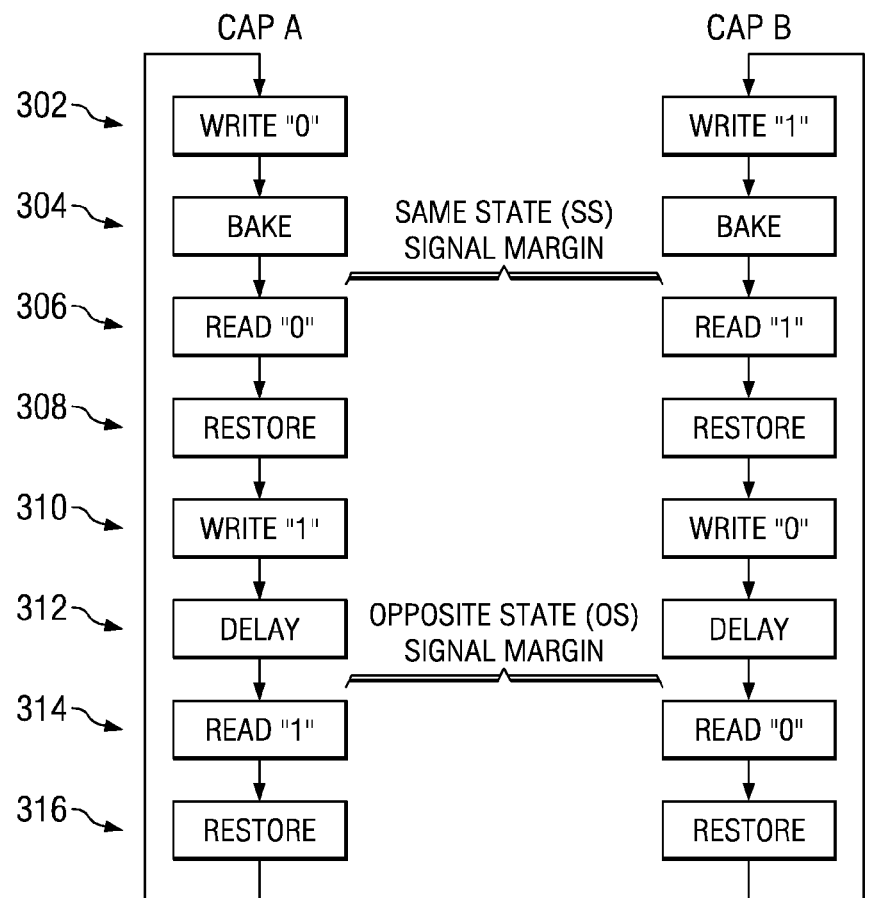
FIG. 3 is a diagram illustrating an exemplary method of analyzing ferroelectric data state degradation and lifetime.

One key to testing the impact that imprint has on FRAM memory cells is evaluating the signal margin of memory cells. One method of evaluation comprises measuring the retention lifetime rates of data state within the memory cells. The retention lifetime rates provide a parameter by which the imprint degradation of ferroelectric memory cells can be monitored. FIG. 3 shows an exemplary method for testing degradation of a ferroelectric capacitor employing a first and a second ferroelectric capacitor, referred to as CAP A and CAP B. The capacitors are distinguished from each other as they will retain opposite data states.

In FIG. 3, testing is performed by writing a low data state (i.e., "0") to CAP A and a high data state (i.e., "1") to CAP B. Since capacitors A and B are arbitrarily chosen, the data state assignment could be reversed. If the test is applied to a plurality of ferroelectric memory cells, data is often written into the FRAM array in a pattern of high and low data states. For example, a checkerboard pattern of "1's" and "0's" may be written into an FRAM array.

At 304 a bake is performed on the FRAM memory cells containing the written data states. The bake comprises exposing the memory cell capacitors to an elevated temperature for a certain time period. The elevated temperature of the bake will simulate a longer length of time at normal operating temperatures and therefore accelerate imprint of the ferroelectric memory cells. Therefore, in FIG. 3, CAP A will undergo imprint in a low data state and CAP B will undergo imprint in a high data state. The time and temperature of the bake may vary depending on the desired results. The longer the exposure time and the higher the exposure temperature the greater the imprint will be. An exemplary bake may be performed at a temperature in the range of 105 to 250 degrees Celsius for 15 minutes to approximately 1000 hours.

The capacitors of the FRAM memory cells are read at 306. A method similar to that of FIG. 2 may be utilized to read the memory cell. If the capacitors are operating properly, CAP A should return a low data state and CAP B should return a high data state. These states are known as Same State (SS) data states since they are the same as the original data states written to the FRAM capacitors at 302.

At 308 the memory data states are restored. Restoring is the same as re-writing. Restoring is necessarily performed after a memory cell storing a high data state is read since reading an FRAM cell is a destructive process. During retention lifetime testing, restoring also serves to simulate normal memory operation of memory cells.

The capacitors are then written to an opposite memory state in 310. The opposite memory state is opposite the state that was written to a capacitor in 302. Therefore, at 310 CAP A is written to a high data state (i.e., "1") and CAP B is written to a low data state (i.e., "0").

A delay for a selected amount of time is performed at 312. The delay used may be as low as 50 mS or as long as 10's of seconds. The delay allows the capacitors to reach a steady state.

At 314 the CAP A and CAP B are read again. If the capacitors are operating properly CAP A will return a high data state and CAP B will return a low data state. These states are known as Opposite State (OS) data states since they are reversed from the original data states. The ferroelectric capacitors are restored again at 316. The process is then repeated.

The probability of CAP A and CAP B returning the proper data states (i.e., high and low, respectively, in our example) upon being read in 314 is reduced due to the imprint caused by baking the capacitors at 304. With each iteration of the process the imprint of the capacitors will be increased by the baking step 304 and the probability of a failure will increase. In a practical situation, the process is performed with a large number of memory cells which statistically causes failures to occur at a greater rate. Retention lifetimes can be determined based upon data collected from repetition of this process.

For a 2T/2C memory architecture, an alternative method for identifying weak memory cells comprises a method by which a diagnostic 1T/1C operating mode is used to identify weak memory cells. Using a 1T/1C operation allows the signal level for each bit of the 2T/2C architecture to be measured. In this method, a 1T/1C reference level is selected and intentionally set to a "guardbanded" level. The guardbanded level will be set to a level that corresponds to a sufficiently strong data signal. The switching signal of a memory bit is read, using the 1T/1C operation. The read signal is compared to the guardbanded level. If the switching signal of the bit is weaker than the guardbanded level, the memory cell would benefit from cycling.

Figure 4:
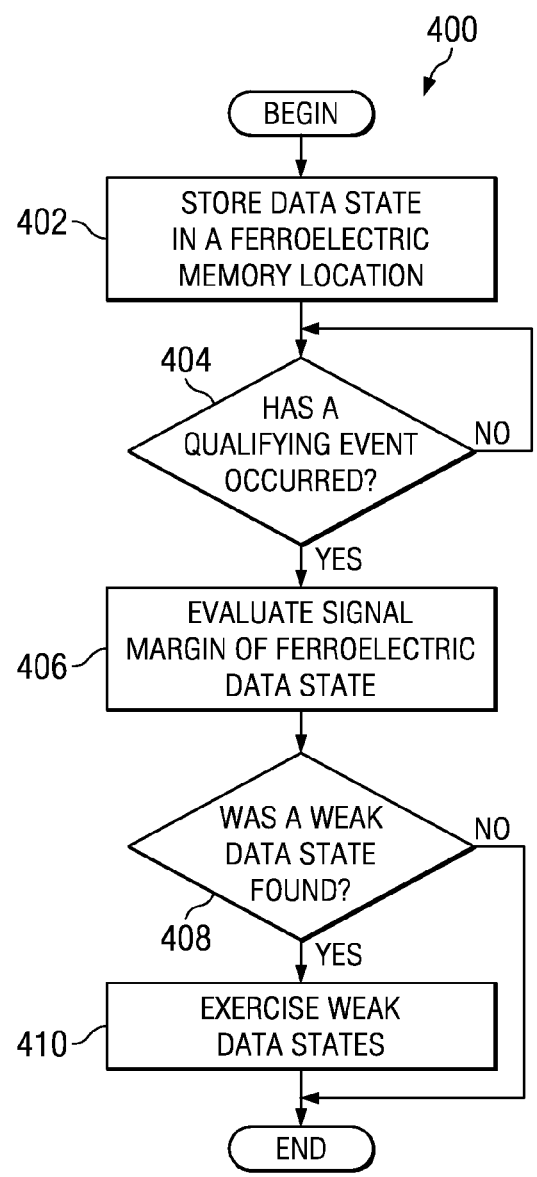
FIG. 4 is a flow diagram of method of cycling data state of an FRAM memory cell in accordance with an embodiment of the present invention.

FIG. 4 shows one embodiment of the present invention. This embodiment is a method 400 for improving reliability and performance of an FRAM memory cell. This method reduces the effect of imprint for an FRAM memory cell by exercising the data state stored in the cell. While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

At 402 a data state is stored in a memory cell. The storing of a data state is done as part of the normal operation of the memory cell. It may be initiated during manufacturing of the integrated chip to store configuration data or it may be initiated by the user of an electronic device comprising the integrated chip. Therefore, 402 may be repeated many times prior to moving to 404. The control circuitry of the integrated chip may store a data state by writing the data state to the memory cell using the method described in FIG. 2, for example. While 402 references writing a single data state, this method may also be used for a plurality of ferroelectric memory data cells. In a practical application this method of improving imprint for memory cells will be applied to an entire FRAM memory array.

At 404 the system is queried as to whether a qualifying event has occurred. If a qualifying event occurs the method advances to 406. If a qualifying event has not occurred then step 404 will be repeated until a qualifying event does occur.

As referenced in this disclosure, the term qualifying event is meant to broadly encompass a wide range of events that a manufacturer may want to trigger exercising the memory. Typically, qualifying events will be based upon definite, predictable functions of the memory cell. For example, power-up or power down of the ferroelectric memory cell may be set as qualifying events which would trigger memory exercising. In another example, the elapse of a certain amount of time may be a qualifying event.

In alternative embodiments of the present invention, the memory cell may be exercised when it is exposed to a high temperature environment (e.g., 105 C) or when its exposure to a high temperature environment is ended. In particular, configuration memory bits are often exposed to high temperatures during manufacturing and assembly processes. Cycling of memory states during or after such processes would reduce the imprint damage done to memory cells during exposure to the high temperature. The inventors have contemplated a wide variety of other qualifying events which may be useful to FRAM memory cells.

At 406 the signal margin of the memory cell is evaluated. Signal margin evaluation may comprise retention lifetime testing and can be performed according to the method of FIG. 3. In alternative embodiments, weak signal strength may be evaluated by operating the memory cells at reduced voltages (below $V_{dd}$) or, for a 2T/2C architecture, by using the diagnostic 1T/1C operating mode. Signal evaluation determines if a weak signal data bit exists in the memory cell. A weak signal data bit is a bit which has a degraded signal margin due to imprint. A weak signal data bit no longer possess a high level of polarization and therefore fails to deliver a high signal margin. Depending on the level of imprint such a memory cell may still be functional, but if left unattended the level of signal margin will continue to decrease eventually rendering the cell useless. In an alternative embodiment of the present invention 406 and/or 408 may be omitted and exercising the memory array may be performed on the entire memory array.

At 410 a memory cell comprising a weak signal data bits is exercised. In one embodiment exercising the memory cell comprises performing one or more simulated data read and data write events (e.g., read and write pulses) of an alternating high data state and a low data state to the memory cell associated with the weak data bit. In such an embodiment the content of the data state will be lost upon exercising the memory cell, therefore making this embodiment only applicable for exercising memory data states which are storing non-critical information.

In an alternative embodiment exercising the data state comprises performing one or more data read/re-write events, whereby the same data state is read and automatically re-written into the memory cell associated with the weak data bit. For example, if the memory cell is storing a "1", the control circuitry would repeatedly read and re-write a "1" data state to the memory cell. Exercising the memory cell in this manner can reduce imprint and reinforce the data state stored in the memory cell.

The manner in which exercising the memory cells is performed has a large impact on the results. In particular, both the number of exercise cycles performed and the rate of exercise cycling are important parameters in both methods 400 and 700. By optimizing these parameters imprint can be further reduced with minimal resource expenditure.

Figure 5:
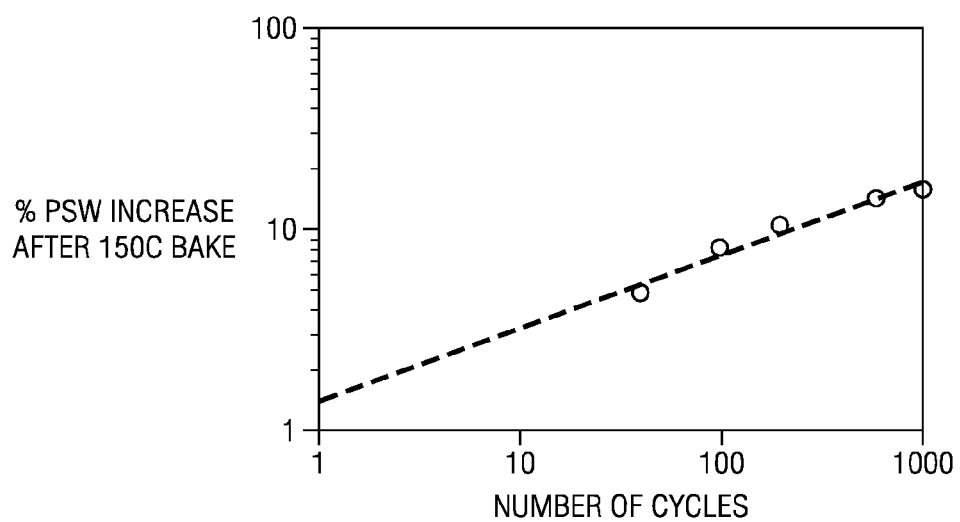
FIG. 5 shows a graph of the percentage increase in signal strength of a memory cell as a function of the number of exercise cycles performed on the cell after exposure to high temperature.

FIG. 5 shows a graph of the signal strength of an FRAM memory cell after exposure to 150 C bake as a function of the number of exercise cycles performed on the cell. The results of this graph show that the imprint of a memory cell is logarithmically reduced as exercise cycling increases. An FRAM memory array that undergoes 100 cycles has an 8-9% increase in the signal strength from an unexercised FRAM memory array. However, increasing the number of cycles to 1000 will only increase the signal strength of the FRAM memory array by 15-20%. Therefore, limiting the number of exercise cycles used in 406 between 1 and 100 will provide a significant gain in signal strength at a minimal expense of time and system resources. As used in this disclosure, the term exercise cycles is intended to include the repetitive exercise acts of all embodiments disclosed in this specification. For example, re-writing the same data state to a memory cell associated with a weak bit should be performed for 1 to 100 pulses.

Figure 6A:
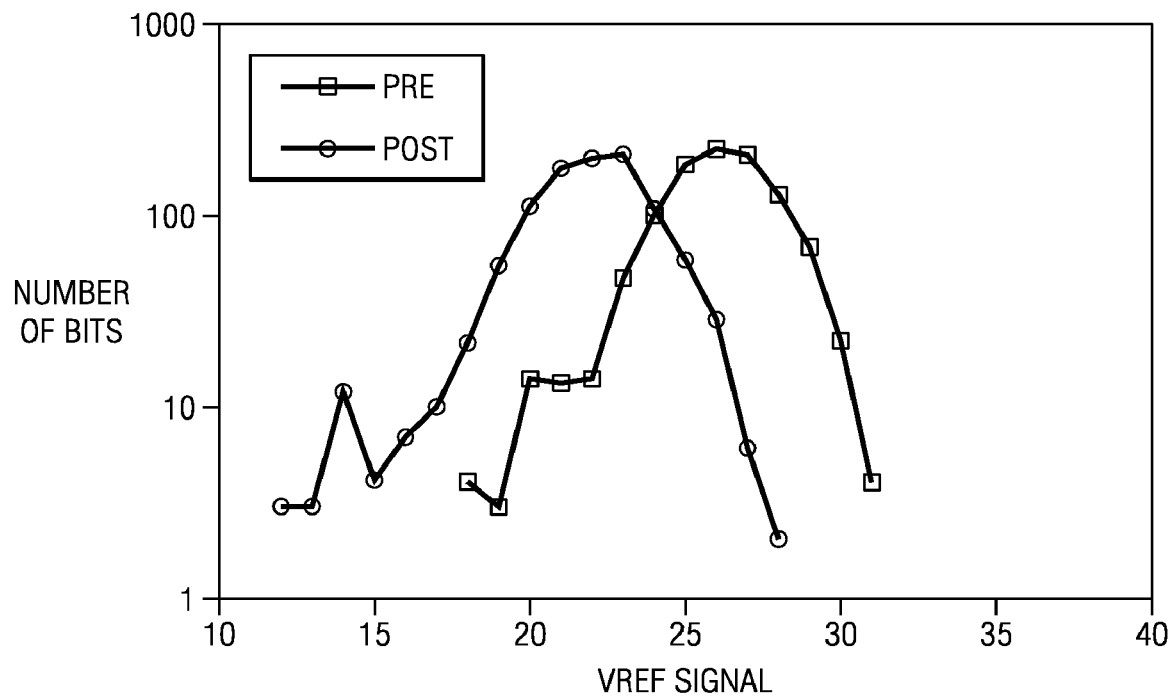
FIG. 6A shows a graph of the number of ferroelectric bits versus the reference signal applied for a capacitor with data states being exercised at a low duty cycle.
Figure 6B:
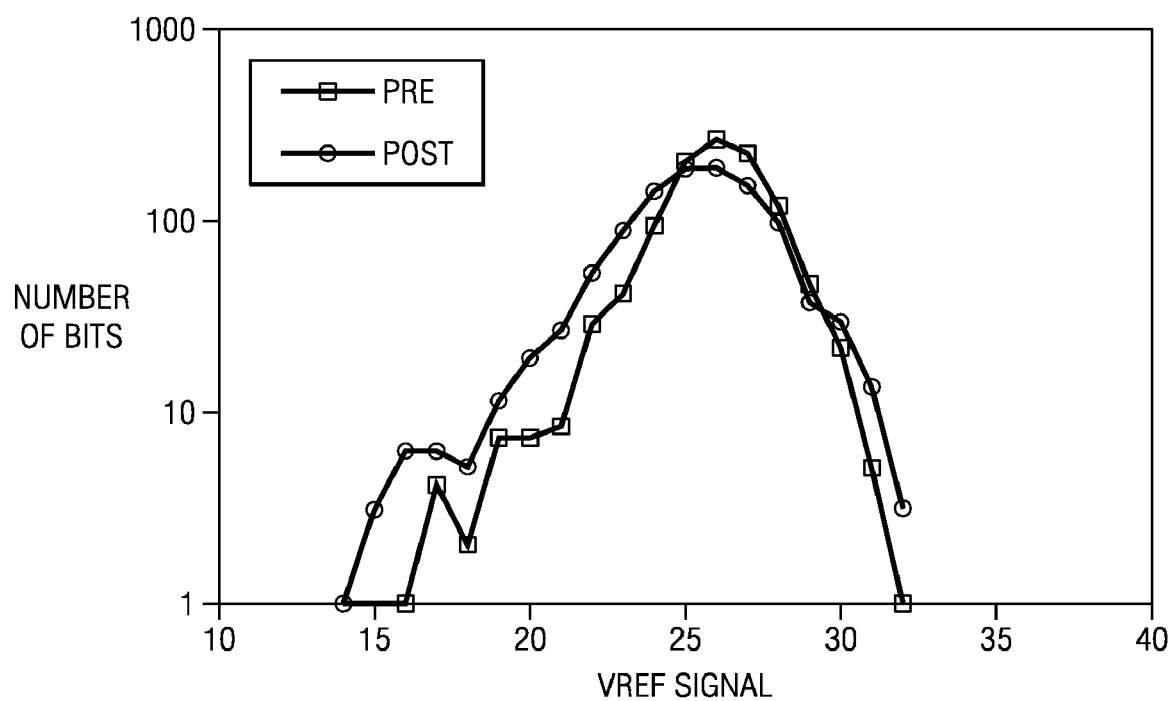
FIG. 6B shows a graph of the number of ferroelectric bits versus the reference signal applied for a capacitor with data states being exercised at a high duty cycle.

FIGS. 6A and 6B show the effects of exercise cycling speed on ferroelectric capacitors exposed to a high temperature (e.g., 105 C or 125 C). Both graphs, 6A and 6B, show two data sequences, one labeled pre and one labeled post. The pre data sequence shows measurements taken of a ferroelectric capacitor prior to a high temperature exposure of 125 degrees Celsius for 500 hours. The post data sequence shows measurements taken of the same ferroelectric capacitor after the high temperature exposure. FIG. 6A shows the distribution of switched polarization signal levels in an FRAM memory array before and after exposure to a high temperature, wherein the data states were cycled at a low duty cycle. FIG. 6B shows signal margin evaluation data taken from an FRAM memory array before and after exposure to a high temperature, wherein the data states were cycled at a high duty cycle.

Comparison of the graphs shows that the FRAM capacitors undergo increased signal reduction because of the effect of imprint when cycling is performed at a low duty cycle. This effect can be attributed to the amount of time that a data state spends in a particular data state. If a low duty cycle is used the memory cell will remain in a particular data state for a larger period of time than if a high duty cycle is used. Therefore, increasing the duty cycle of exercising in 410 will help to maintain the signal strength and mitigate imprint related signal reduction.

FIGS. 6A and 6B also show that increased frequency of data cycling is especially important to high density FRAM arrays, where the bit access duty cycle is expected to be low (i.e., for a large memory array, it is expected that individual bits will be accessed less frequently during normal use).

Figure 7:
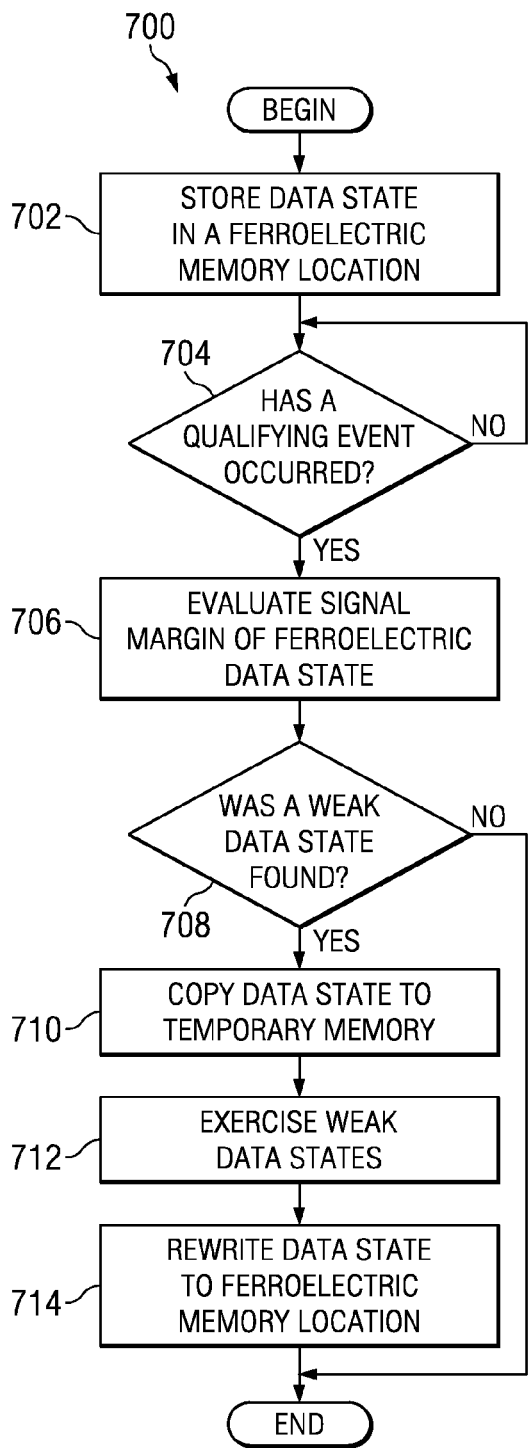
FIG. 7 is a flow diagram of an alternative method of exercising a data state stored in a memory cell of FRAM memory array.

FIG. 7 shows an alternative embodiment of the present invention. This embodiment is a method 700 for improving reliability and performance of FRAM memory cells storing critical data, where critical data refers to data users don't want to lose during exercising.

At 702 a data state is stored in a ferroelectric memory cell. As in 402, storage of the data state is part of the normal use of the memory and may be repeated many times prior to 704.

At 704, the system waits for a qualifying event to occur. Once a qualifying occurs, the system evaluates the signal margin of the ferroelectric memory cell at 706.

If a weak state is identified at 708, the data state stored in the memory cell is copied to another memory location at 710. For example, if a "1" is stored in the memory cell, the control circuitry will write the "1" into a cache memory. Copying the data state to another memory location is done to ensure that the data stored in the memory location is not lost while the memory cell is exercised. This embodiment is especially important for information stored in memory cells which is necessary to retain after exercising. For example, if code is stored in the memory states the user may want to save the code prior to exercising so that it is not lost.

Once the data state is safely stored in the memory location the memory cell is exercised at 712. As discussed earlier, exercising the memory cell is optimally performed at a high duty cycle for 1-100 cycles. At 714, the data state stored in the memory location is rewritten to the memory cell. Therefore, the entire method 700 will reduce the imprint of the memory cell without losing the data stored in it.

To minimize the impact on memory performance the signal margin evaluation testing and exercise cycling of methods 400 and 700 are performed in the background of normal memory operation. Running in such a "background mode", exercising the memory cells of the array is transparent to users of the array.

In an additional embodiment, method 700 will be applied to sub-section of the entire memory array. In this embodiment the memory array addresses will be grouped into small blocks. Once a qualifying event has occurred, acts 706-714 will be performed on a single small block of memory address. When that memory address has been tested and exercised the control circuitry will go onto the next small block of memory addresses. Repeating this process, the control circuitry will test and exercise the entire memory array. By breaking the memory array up into smaller sections, the amount of cache memory can be reduced to only store the memory data states of a sub-section of the memory array instead of the entire array.

In an alternative embodiment of the present invention a bit access method maintains an approximately uniform duty cycle by keeping track of the number of accesses to memory address locations. In this embodiment infrequently used address locations are forced to exercise their data. This method causes minimal interruptions to normal memory operation as the states are infrequently used. But, this method is especially important in reducing imprint because the rarely used cells targeted are especially susceptible to imprint as they stay in a memory state for an extended period of time.

Figure 8:
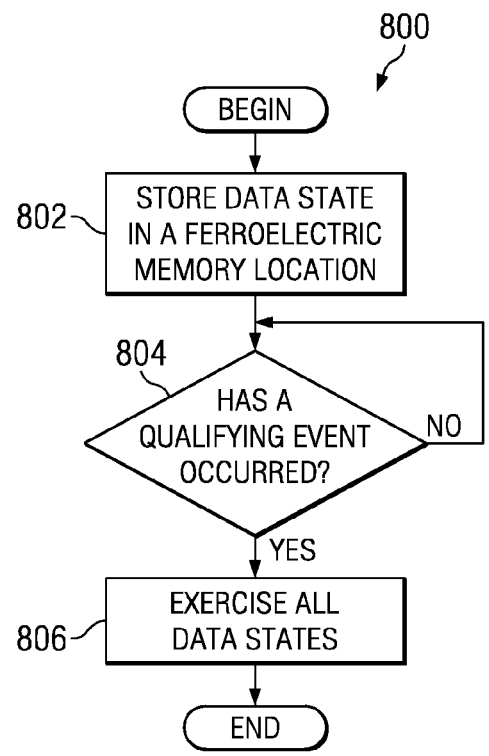
FIG. 8 is a flow diagram of an alternative method of exercising the entirety of data states stored in an FRAM array without signal margin evaluation.

Another alternative embodiment of the present invention is shown in FIG. 8. This method is similar to methods 400 and 700 except that in method 800 the evaluation of the signal margin action (406, 706) of methods 400 and 700 is omitted. If a time-independent qualifying event (e.g., power-up, power down) is detected at 804, the entire plurality of memory cells comprising the memory array are exercised. For example, upon exposure to a high temperature, or any other qualifying event, all memory cells in a memory array will undergo a single data read and re-write event (e.g., read pulse) or a single alternating data read and data write event (e.g., read and write pulse) of an alternating high data state and a low data state. This embodiment ensures that all bits of a memory array are exercised upon experiencing a qualifying event.

In an additional alternative embodiment of the present invention the entire plurality of memory cells comprising the memory array will undergo a single data read and re-write event (e.g., read pulse) to a single data state upon the occurrence of a qualifying event, wherein the qualifying event is a predetermined time event (e.g., the FRAM array is exercised every 7 days, 30 days, etc.). The predetermined time event may be set by a user.

Figure 9:
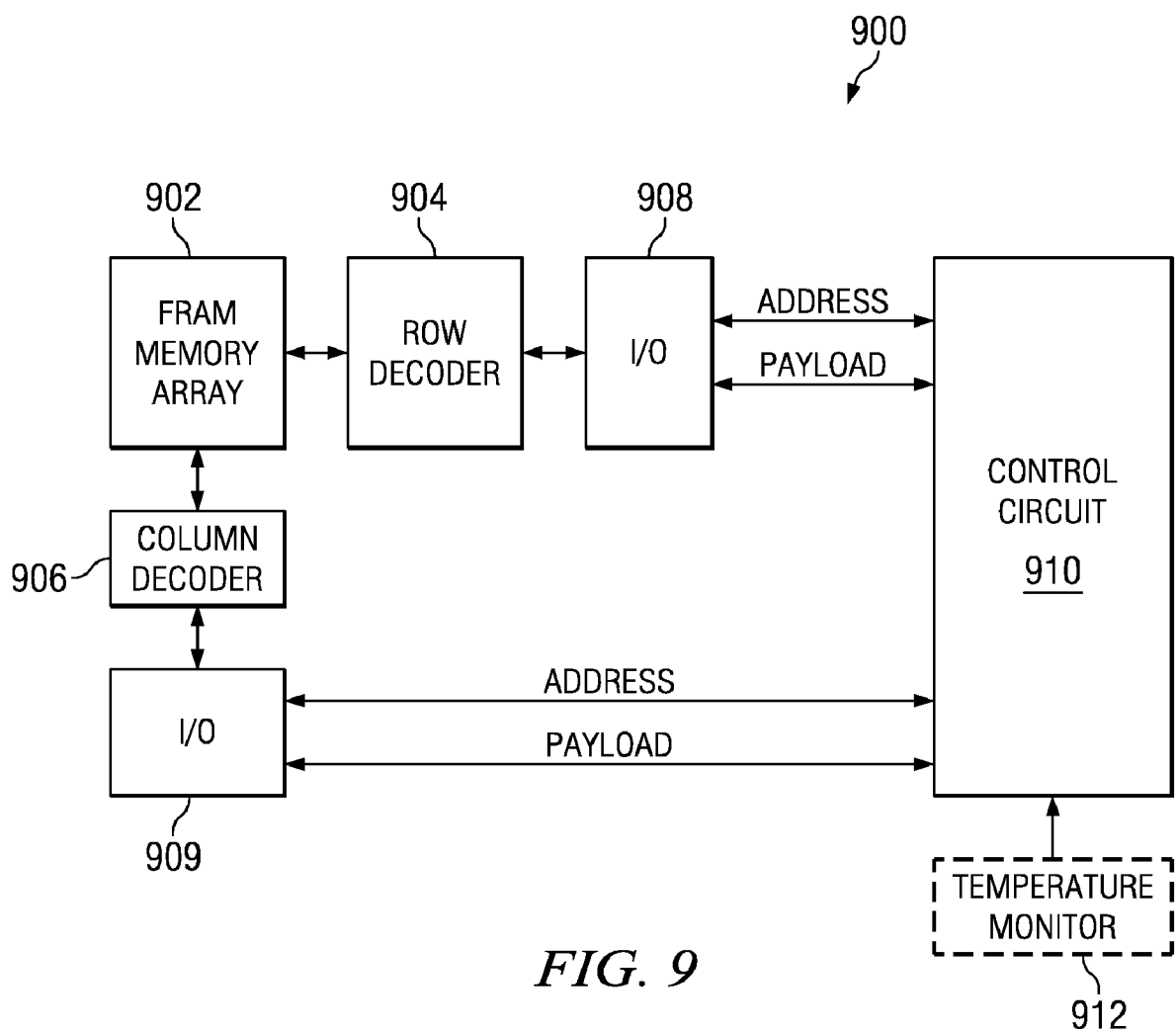
FIG. 9 is a block diagram of the FRAM memory cell with a control circuitry.

FIG. 9 shows a block diagram of a memory organization 900. The memory array 902 is connected to row 904 and column 906 decoders, which route information to and from addresses within the memory array. The decoders, 904 and 906, are connected to an input/output (I/O) interfaces 908, 909. Furthermore, a control circuitry 910 is included. The control circuitry is important in implementation of the above embodiments. It checks to make sure that a qualifying event has occurred, performs signal margin evaluation and accordingly exercises memory cells with weak data state signal strength. In this diagram the control circuitry 910 indirectly receives an address and payload information from the memory array 902. From this information the control circuitry 910 may monitor at what time addresses and payloads have been inverted and decide if either an inversion process needs to begin. In another embodiment an optional temperature monitor 912 is added which provides a signal to the control circuitry 910 if the temperature exceeds a predetermined temperature range.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method, comprising:

detecting an occurrence of a qualifying event;

evaluating a signal margin of a ferroelectric memory cell located within a ferroelectric random access memory (FRAM) array upon the occurrence of the qualifying event and identifying whether or not the ferroelectric memory cell comprises a weak signal bit;

copying a ferroelectric memory data state associated with the weak signal bit from the ferroelectric memory cell to an alternative memory data state in an alternative memory location prior to exercising the ferroelectric memory cell associated with the weak signal bit;

exercising the ferroelectric memory cell associated with the weak signal bit; and writing the alternative memory data state to the ferroelectric memory data state in the ferroelectric memory cell associated with the weak signal bit after the exercising the ferroelectric memory cell associated with the weak signal bit is completed;

wherein exercising the ferroelectric memory cell is performed by applying one or more data read/re-write pulses or one two or more alternating high state and low state data read and data write pulses to the ferroelectric memory cell associated with the weak signal bit.

2. The method of claim 1, further comprising:

storing a ferroelectric memory data state in the ferroelectric memory cell prior to detecting the occurrence of the qualifying event.

3. The method of claim 1 wherein a control circuitry utilizes a result of the evaluation to determine whether or not exercising of the ferroelectric memory cell is needed.

4. The method of claim 1, wherein exercising the ferroelectric memory cell is performed between 1-100 exercise cycles.

5. The method of claim 4, wherein evaluating the signal margin of the ferroelectric memory data state is performed in the background of normal FRAM array operation and wherein exercising the ferroelectric memory cell comprising the weak signal bit is performed in the background of normal FRAM array operation.

6. The method of claim 4, further comprising:

storing a number of accesses to a memory address location; and forcing exercising to be performed on the ferroelectric memory cell associated with the memory address location with a low number of accesses.

7. The method of claim 4, further comprising:
dividing the FRAM array into a plurality of memory sub-sections prior to evaluating the signal margin and exercising the ferroelectric memory cell, wherein evaluating the signal margin and exercising the ferroelectric memory cell are only performed on one of the plurality of memory sub-sections at a time.

8. The method of claim 4, wherein exercising the ferroelectric memory cell comprises performing one or more simulated data read and data write pulses of a high data state and a low data state.

9. The method of claim 4, wherein exercising the ferroelectric memory cell comprises reading/re-writing a memory data state associated with the ferroelectric memory cell one or more times.

10. The method of claim 4, wherein the qualifying event comprises: a power up of the FRAM array or a power-down of the FRAM array.

11. The method of claim 4, wherein the qualifying event comprises detecting exposure of the FRAM array to a high temperature, and wherein exercising the ferroelectric memory cell associated with the weak signal bit is performed while the FRAM array is at the high temperature.

12. The method of claim 4, wherein the qualifying event comprises the FRAM array returning from a high temperature exposure to a non-high temperature exposure, and wherein exercising the ferroelectric memory cell associated with the weak signal bit is performed after the FRAM array has returned to the non-high temperature.

13. The method of claim 4, wherein the FRAM array comprises a 2T/2C memory array.

14. The method of claim 13, wherein evaluating the signal margin of the 2T/2C memory array is performed using a diagnostic 1T/1C operating mode, comprising:
selecting a 1T/1C reference level, wherein the 1T/1C reference level corresponds to a memory data state signal of a properly functioning ferroelectric memory cell;
reading a switching signal of the ferroelectric memory cell using a 1T/1C operation; and
comparing the switching signal of the ferroelectric memory cell to the 1T/1C reference level, wherein the ferroelectric memory cell is exercised if the switching signal is smaller than the 1T/1C reference level.

15. A method, comprising:
detecting an occurrence of a time independent qualifying event of a ferroelectric random access memory array containing a plurality of ferroelectric memory cells;
copying ferroelectric memory data states from the plurality of ferroelectric memory cells to alternative memory data states in a plurality of alternative memory locations prior to exercising the plurality of ferroelectric memory cells;
exercising the plurality of ferroelectric memory cells; and
writing the alternative memory data states to the ferroelectric memory data states in the plurality of ferroelectric memory cells after the exercising is completed;
wherein exercising the plurality of ferroelectric memory cells is performed by applying one or more data read/re-write pulses or one or more alternating data read and data write pulses to the entire plurality of ferroelectric memory cells comprising the FRAM array.

16. A method, comprising:
detecting an occurrence of a qualifying event of a ferroelectric random access memory array containing a plurality of ferroelectric memory cells, wherein the qualifying event comprises a predetermined time;
copying ferroelectric memory data states from the plurality of ferroelectric memory cells to alternative memory data states in a plurality of alternative memory locations prior to exercising the plurality of ferroelectric memory cells;
exercising the plurality of ferroelectric memory cells; and
writing the alternative memory data states to the ferroelectric memory data states in the plurality of ferroelectric memory cells after the exercising is completed;
wherein exercising the plurality of ferroelectric memory cells comprises reading/re-writing a memory data state to the entire plurality of ferroelectric memory cells comprising the FRAM array one or more times.

* * * * *